United States Patent [19]

Croup

[11] 3,941,207

[45] Mar. 2, 1976

[54] LOUDSPEAKER ASSEMBLY

[75] Inventor: Robert E. Croup, Indianapolis, Ind.

[73] Assignee: Acoustic Fiber Sound Systems, Inc., Indianapolis, Ind.

[22] Filed: Aug. 26, 1974

[21] Appl. No.: 500,597

[52] U.S. Cl. .......... 181/199; 181/156
[51] Int. Cl.[2] .......... H05K 5/00; A47B 81/06
[58] Field of Search .......... 181/148–156, 181/199

[56] References Cited

UNITED STATES PATENTS

| | | | |
|---|---|---|---|
| 2,992,695 | 7/1961 | Everitt | 181/199 |
| 3,592,290 | 7/1971 | Armstrong | 181/151 |
| 3,749,198 | 7/1973 | Everitt et al. | 181/155 |
| 3,757,889 | 9/1973 | Everitt | 181/199 |
| 3,811,532 | 5/1974 | Everitt | 181/156 |
| 3,848,696 | 11/1974 | Everitt | 181/156 |

*Primary Examiner*—Stephen J. Tomsky
*Attorney, Agent, or Firm*—Prangley, Dithmar, Vogel, Sandler & Stotland

[57] ABSTRACT

A loudspeaker assembly comprising a loudspeaker including a front mounting flange having front surfaces, and an enclosure for the loudspeaker including a front wall and a rear wall and a top wall and a bottom wall and opposed side walls all having at least two layers of corrugated material, the inner layers of the walls being formed from a single inner member including a front panel having opposed top and bottom panels and opposed side panels hingedly connected thereto and rear panel sections respectively hingedly connected to the opposed panels, two of the rear panel sections cooperating to provide an inner rear panel and the other two of the rear panel sections cooperating to provide an outer rear panel; in one form, the loudspeaker is fixed to the inner member by having slots in opposed panels receiving the mounting flange therethrough with an adhesive between the front loudspeaker surfaces and the front panel; in the other form, the opposed top and bottom panels and the opposed side panels at the juncture of the front panel snugly receive the periphery of the speaker mounting flanges, and the inner surface of the front panel and the rear surface of the inner rear panel are respectively secured by adhesive to the front surfaces and the rear surfaces of the loudspeaker.

21 Claims, 14 Drawing Figures

LOUDSPEAKER ASSEMBLY

BACKGROUND OF THE INVENTION

The present invention relates generally to improvements in loudspeaker assemblies, and specifically to the provision of an assembly inlcuding an enclosure having two layers of corrugated material in each wall, the inner layers being a single integral inner member.

Loudspeaker assemblies heretofore having multilayers of corrugated material in each wall, utilized several members to provide the inner layers of the walls, examples of such prior structures being shown in U.S. Pat. No. 3,757,889 granted Sept. 11, 1973 to Scott F. Everitt and U.S. Pat. No. 3,789,953, granted Feb. 5, 1974 to Scott F. Everitt. Although highly effective as enclosures in the sense that they provide good acoustical properties for the loudspeaker assembly, these prior structures have been difficult to manufacture and have required extensive tooling to have economic mass production thereof. Special precautions also have had to be taken in these prior structures to be sure that the loudspeaker is firmly anchored and secured to the enclosure therefor.

SUMMARY OF THE INVENTION

The present invention provides a loudspeaker assembly wherein the inner layers of corrugated material for all the walls are povided as a single integral inner member, whereby to simplify assembly thereof and essentially to eliminate the necessity for providing tooling for the mass production of the loudspeaker assembly. Further, the loudspeaker is firmly secured to and trapped within the loudspeaker enclosure.

This is accomplished in the present invention, and it is an object of the present invention to accomplish these desired results, by providing a loudspeaker assembly of a loudspeaker including a front mounting flange having front surfaces lying in a common plane, and an enclosure for the loudspeaker including a front wall and a rear wall and a top wall and a bottom wall and opposed side walls, each of the walls including at least two layers of corrugated material and the front wall having an opening therein to facilitate the emission of sound waves therefrom, the inner layers of the walls being formed from a single inner member including a front panel having opposed top and bottom panels and opposed side panels hingedly connected thereto and a rear panel hingedly connected to one of the opposed panels, structure holding the front surfaces of the loudspeaker adjacent to the inner surface of the front panel to hold the loudspeaker in position within the inner members, and means holding the panels assembled with respect to each other and about the loudspeaker to provide an integral inner member for the loudspeaker assembly.

In connection with the foregoing object, another object of the invention is to provide a loudspeaker assembly of the type set forth, wherein the top and bottom panels have rear panel sections respectively hingedly connected thereto and the side panels have rear panel sections respectively hingedly connected thereto, the rear panel sections cooperating to provide the inner rear panel of the rear wall.

Another object of the invention is to provide a loudspeaker assembly of the type set forth, wherein two of the rear panel sections cooperate to provide an inner rear panel and the other two of the rear panel sections cooperate to provide an outer rear panel, the inner rear panel sections having laterally extending ears thereon and the panels carrying the outer rear panel sections having slots therein receiving the ears to hold the rear panel sections and the opposed top and bottom panels and the opposed side panels in the assembled positions thereof.

Yet another object of the invention is to provide a loudspeaker assembly of the type set forth, wherein the inner layers of two of the opposed side walls adjacent to the juncture with the inner layers of the front wall have slots therein receiving one of the loudspeaker mounting flange projections therein, the inner surface of the front wall being adhesively secured to the adjacent front surfaces of the loudspeaker mounting flange.

Still another object of the invention is to provide a loudspeaker assembly of the type set forth, wherein the inner layers of the opposed side walls adjacent to the juncture with the inner layers of the front wall snugly receive the periphery of the front mounting flange therebetween, and the inner surfaces of the inner layers of the front wall and the rear wall snugly receive the loudspeaker therebetween, thereby to trap and secure the loudspeaker within the enclosure in all directions with respect thereto.

In connection with the foregoing object, another object of the invention is to provide a loudspeaker assembly of the type set forth, wherein the front surfaces of the front mounting flange are adhesively secured to the inner surface of the front wall and the rear surfaces of the rear of the loudspeaker are adhesively secured to the inner surfaces of the rear wall.

A further object of the invention is to provide a loudspeaker sub-assembly in accordance with any of the foregoing objects wherein the sub-assembly consists of the loudspeaker and the integral inner member.

Further features of the invention pertain to the particular arrangement of the parts of the loudspeaker assembly and sub-assembly, whereby the above outlined and additional operating features thereof are attained.

The invention, both as to its organization and method of operation together with further features and advantages thereof will best be understood with reference to the following specification taken in connection with the accompanying drawings.

DESCRIPTION OF THE PREFERRED EMBODIMENTS

Figure 1:
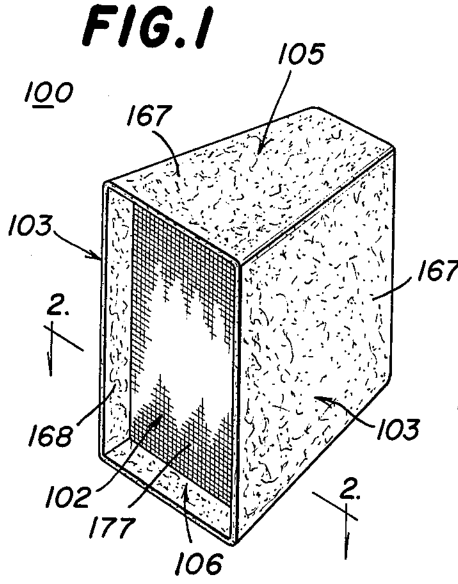
FIG. 1 is a perspective veiw of a first embodiment of a loudspeaker assembly made in accordance with and embodying the principles of the present invention.

Referring to FIGS. 1 to 7 of the drawings, there is illustrated the first embodiment of the loudspeaker assembly 100 made in accordance with and embodying the principles of the present invention. As illustrated, the loudspeaker assembly 100 includes a loudspeaker 150 having disposed therearound an enclosure 101 formed of an inner member 110, an outer member 160, a spacer 170, a grille board 175 and a back member 180.

Figure 2:
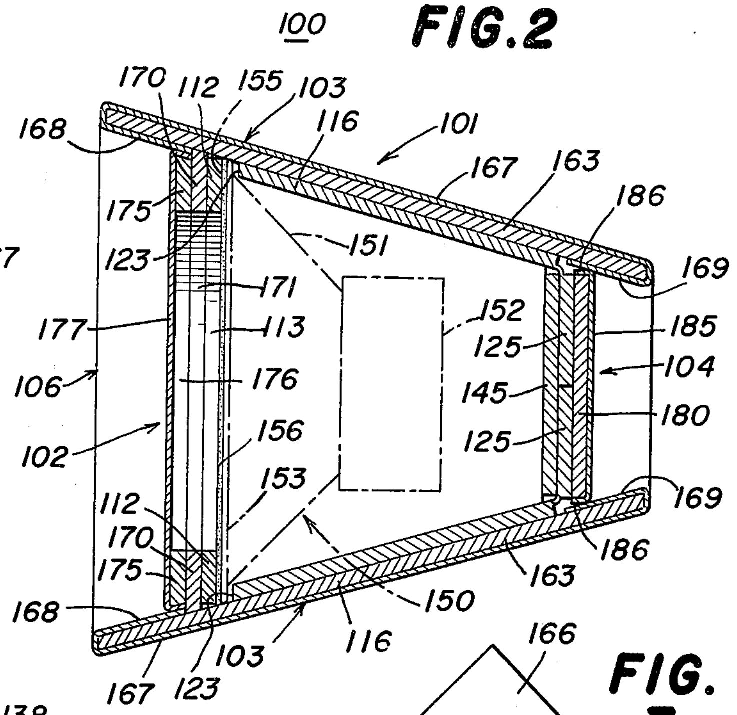
FIG. 2 is a view in horizontal section along the line 2—2 in FIG. 1.

From FIGS. 1 and 2 it will be seen that the enclosure 101 includes a front wall 102, two opposed side walls 103, a rear wall 104 and opposed top and bottom walls 105 and 106, respectively. Each of the walls 102 through 106 is formed of two layers of corrugated material, and the outer surfaces of the walls are preferably provided with a decorative covering, all as will be described more fully hereinafter.

Figure 4:
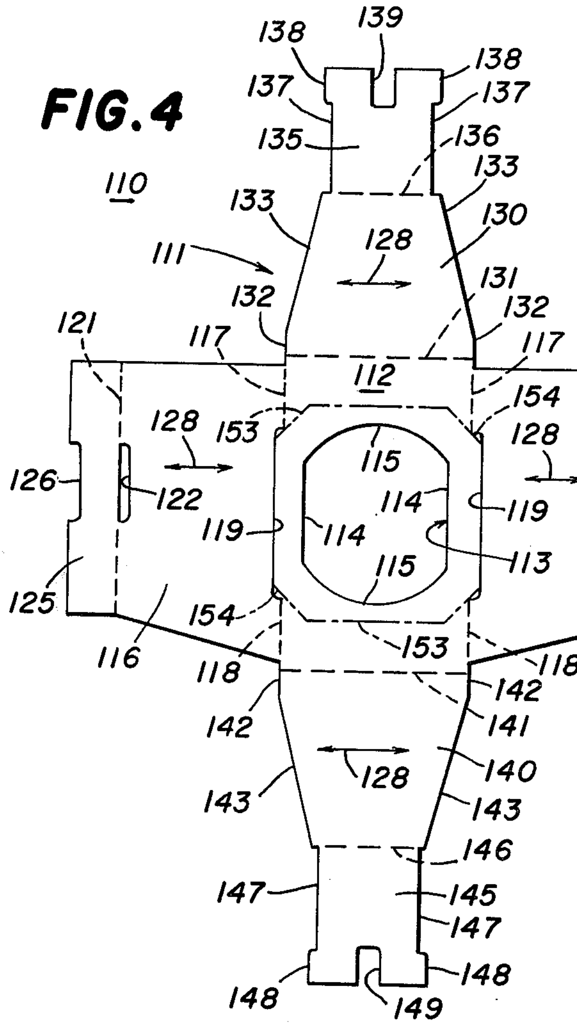
FIG. 4 is a plan view of the inner member of the loudspeaker enclosure of FIG. 1 in its flattened condition.
Figure 5:
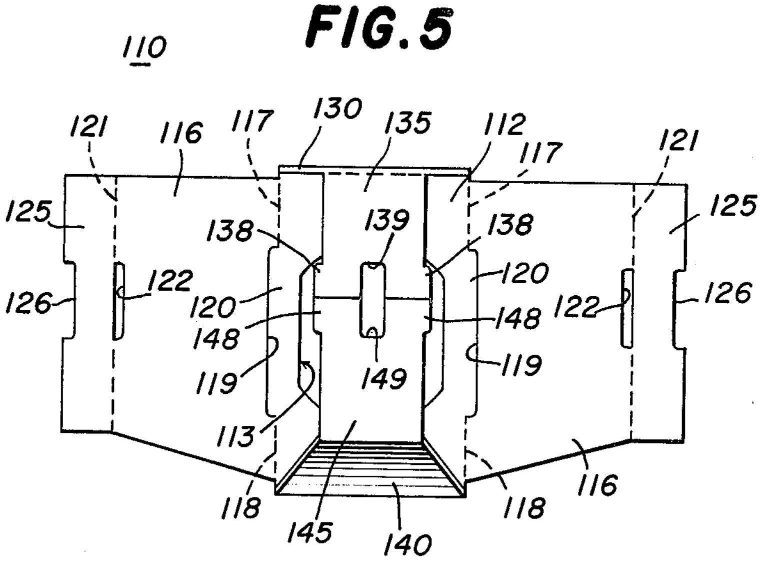
FIG. 5 is a rear view of the inner member of FIG. 1 in a partially assembled condition.
Figure 6:
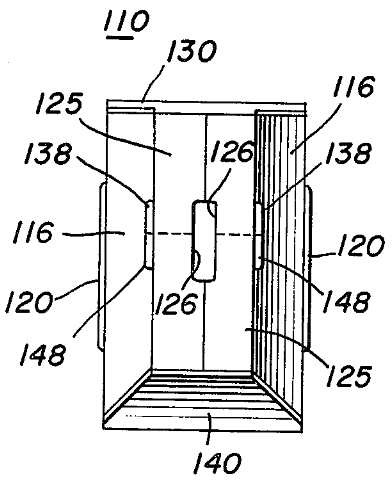
FIG. 6 is a rear view of the inner member of FIG. 1 in its fully assembled condition.

In accordance with the present invention, the inner layers of the several walls 102 through 106 are provided by the single unitary inner member 110, the construction of which is best illustrated in FIGS. 4, 5 and 6 of the drawings. The inner member 110 consists of a single sheet 111 of corrugated material having the usual pair of liner sheets with corrugations disposed therebetween and adhesively secured thereto. The sheet 111 in turn is shaped, scored, and has cutouts therein providing and defining the several parts thereof. There is provided a generally rectangular front panel 112 that forms the inner layer of the front wall 102 and has centrally thereof an opening 113 useful in facilitating the emission of sound waves from within the enclosure 101, the opening 113 having opposed straight sides 114 connected at the outer ends thereof by curved sides 115.

Hingedly connected to the front panel 112 are two side panels 116 which form the inner layers of the side walls 103. A low knife cut along the dashed lines 117 and 118 forms the hinged connection between the front panel 112 and the side panels 116. The low knife cuts 117 and 118 as illustrated in FIG. 4 extend through the lower one of the outer liners of the corrugated material and through the corrugated layer, but do not go through the liner disposed upwardly in FIG. 4, that uncut liner providing the hinged connections between the front panel 112 and the side panels 116. However, a full cut is made at 119, the cut 119 being U-shaped and joining at the ends thereof the cuts 117 and 118 so as to provide opposed projections 120 extending outwardly from the periphery of the front panel 112 (see FIGS. 6 and 7) and rectangular openings 123 (see FIG. 2) defined between the cut 119 and the projections 120 for receiving flanges on the loudspeaker 150, all as will be described more fully hereinafter. The outer edges of the side panels 116 carry outer rear panels 125, respectively, connected thereto by hinge portions formed by a low knife cut along the line 121 like the low knife cuts 117 and 118 described above. Each of the outer rear panels 125 is generaly rectangular in shape, but one of the longer edges thereof has a notch 126 therein. There also is provided a rectangular slot 122 cut in each of the side panels 116 adjacent to the low knife cut 121.

The shorter edges of the front panel 112 carry integral thereon and hingedly attached thereto a top panel 130 and a bottom panel 140. More specifically, the top panel 130 is defined at its lower edge as viewed in FIG. 4 by a perf-score 131 providing the hinged connection, the top panel 130 including opposed parallel straight edges 132 and inwardly converging tapered edges 133 that terminate at a perf-score 136 hingedly connecting an inner rear panel 135 to the outer edge of the top panel 130. The inner rear panel 135 has generally parallel side edges 137 having at the outer ends thereof outwardly extending generally rectangular ears 138, the outer edge of the inner rear panel 135 carrying a generally rectangular notch 139 therein. The perf-scores 131 and 136 comprise alternate sections of scoring and perforations along the lines indicated in the drawings, the scoring comprising a depression of one of the liners and the corrugated layer toward the other of the liners while the perforation comprises a cut through one of the liners and the corrugated layers and down to but not through the other of the liners. In a specific example, preferred for use herein, each perforation section is approximately one quarter inch long and the intervening score sections are each likewise one quarter inch long.

Hingedly connected to the lower edge of the front wall 112 as viewed in FIG. 4 is the bottom panel 140 connected thereto by a hinged portion provided by a perf-score 141. The bottom panel 140 includes a pair of parallel straight edges 142 joining tapered and inwardly coverging side edges 143 terminating in a perf-score 146 that hingedly connects an inner rear panel 145 thereto. The inner rear panel 145 has parallel edges 147 carrying on the other ends thereof generally rectangular and laterally extending ears 148. The outermost edge of the inner rear panel 145 has a notch 149 therein shaped like the notch 139.

Referring particularly to FIG. 2, the loudspeaker 150 includes the usual frame 151 carrying a magnet housing 152, the frame 151 having on the front thereof a mounting flange 153 having front surfaces 155 and including outwardly extending projections 154 thereon. The projections 154 on the mounting flange 153 are adapted to extend into the slots openings 123 provided by the cuts 119 and to lie against the inner surface of the projections 120, a layer of adhesive 156 being provided between the front surfaces 155 of the mounting flange 153 and the inner surface of the front panel 112, including the projections 120 thereon.

The inner member 110 can be readily assembled about the loudspeaker 150 to mount the loudspeaker 150 within the inner member 110, thus to provide a sub-assembly for the loudspeaker assembly 100. The assembly of the inner member 110 about the loudspeaker 150 can be accomplished without the use of any jigs or fixtures, thereby materially to simplify and to speed the assembly process. In assembling the inner member 110 about the loudspeaker 150, an adhesive is applied to the appropriate areas of the inner surface of the front panel 112 and the front surfaces 155 of the mounting flange 153 including the projections 154 thereon. The loudspeaker 150 is then placed upon the inner member 110 as illustrated in FIG. 4, the mounting flange 153 and the projections 154 being shown in dot-dash lines therein. The top panel 130 and the bottom panel 140 are then folded to the positions illustrated in FIG. 5, and the inner rear panels 135 and 145 are likewise folded to the positions illustrated in FIG. 5. It will be seen that the ears 138 and 148 join to form a single lateral projection on each side, and likewise the notches 139 and 149 combine to provide a single rectangular opening in the rear panel of the inner member 110. Next the side panels 116 are folded upwardly from the positions illustrated in FIG. 5 to those illustrated in FIG. 6. In so doing, the projections 154 on the loudspeaker mounting flange 153 are automatically positioned in the openings 123 provided by the cuts 119 so that the projections 145 on the loudspeaker mounting flange 153 overlie the projections 120 on the front panel 112. Then the outer rear panels 125 are folded over the inner rear panels 135 and 145, this automatically extending the ears 138–148 through the rectangular slots 122. A layer of adhesive (not shown) is then provided between the facing surfaces of the inner rear panels 135–145 and the outer rear panels 125 firmly to secure the same together. The securing together of the rear panels firmly secures each of the panels forming the inner member 110 with respect to each other and about and with respect to the loudspeaker 150. There results a sub-assembly of the loudspeaker 150 and the inner member 110, all without the use of any jigs or fixtures during the assembly thereof.

Figure 3:
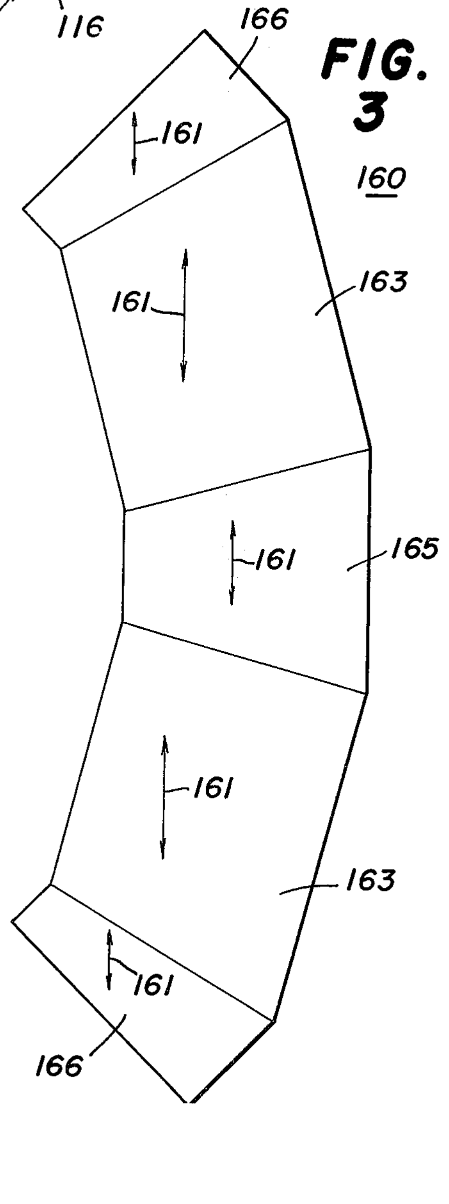
FIG. 3 is a plan view of the outer member of the loudspeaker enclosure of FIG. 1 in its flattened condition.

In order to provide the outer layer of corrugated material for each of the walls 102 through 106, an outer member 160 is placed therearound, the shape of the outer member 160 in the flat being illustrated in FIG. 3 of the drawings. Two side panels 163 are provided hingedly connected to an intermediate top panel 165. Two bottom panels 166 are provided on the other edges of the side panels 163. As is best illustrated in FIG. 2, the outer member 160 is completely covered by a decorative sheet 167, formed for example of a synthetic organic resin such as a polyvinyl chloride resin. The decorative sheet 167 fundamentally covers the exposed portions of the outer member 160, but also is folded around the ends thereof to provide an inner front section 168 and an inner rear section 169, the decorative sheet being suitably secured as by adhesive to the outer member 160 substantially throughout the contacting surfaces thereof.

Disposed in front of the assembled inner member 110 is a spacer 170 of corrugated material having a circular opening 171 therein that is in registry with the opening 113 in the front panel 112 of the inner member 110. Disposed in front of the spacer 170 is a grille board 175, which may be formed of a composition board, and has centrally therein an opening 176 in general registry with the opening 171. Covering the outer surface of the grille board 175 including the opening 176 and extending around the edges thereof is a grille cloth 177.

The rear of the enclosure 101 is closed by a back member 180 which has a central rectangular opening 181 therein that registers with the opening formed by the cooperation of the notches 126, 139 and 149, the openings receiving electrical conductors or connectors for the loudspeaker 150. The back member 180 is also covered by a decorative sheet 185 like the decorative sheet 167, the decorative sheet 185 extending around the edges of the back member 180 as at 186.

Figure 7:
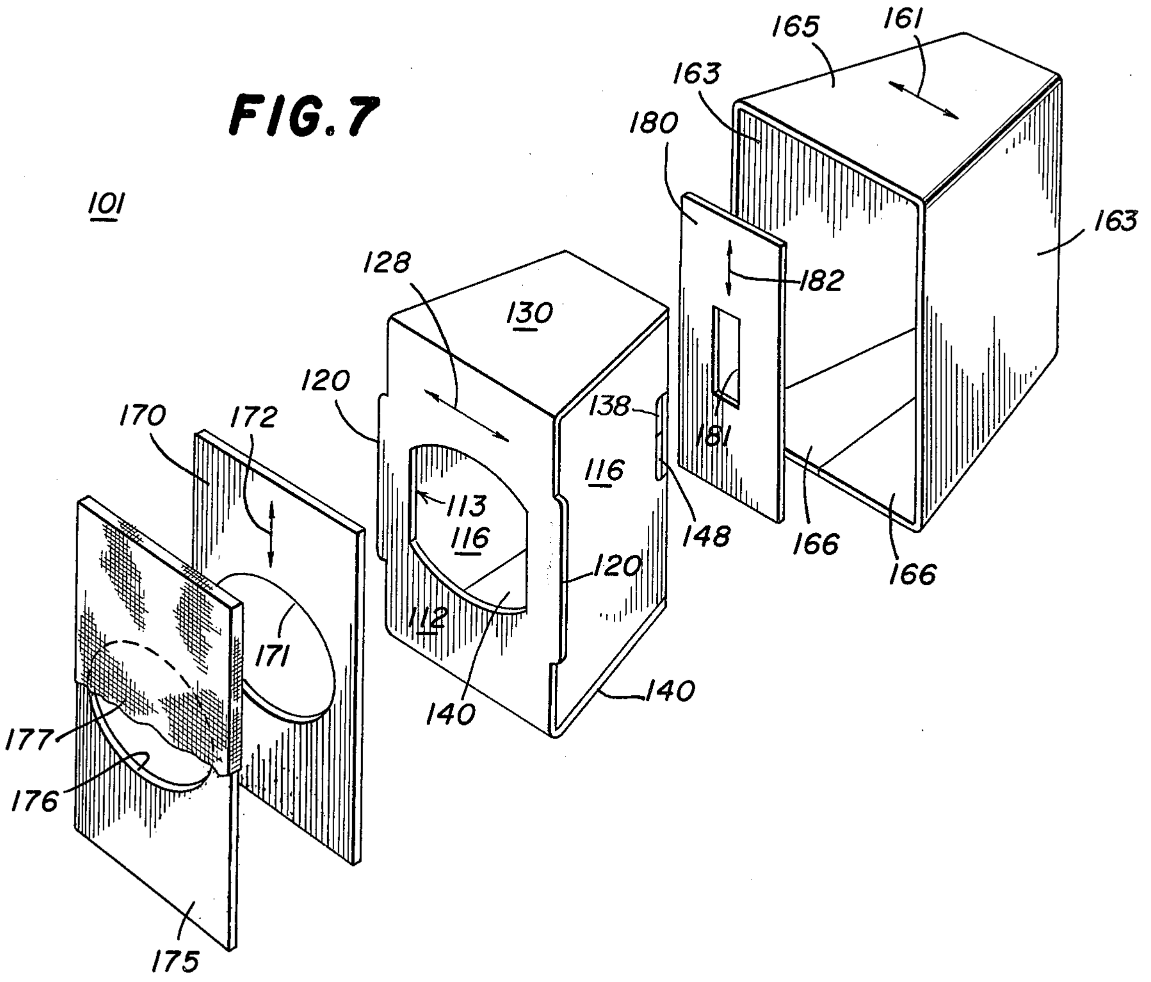
FIG. 7 is an exploded perspective view of the parts forming the loudspeaker enclosure of FIG. 1.

Each of the parts of the enclosure 101 including the inner member 110, the outer member 160, the spacer 170, the grille board 175 and the back member 180 are shaped and arranged to cooperate with each other to provide a finished enclosure as illustrated in FIGS. 1 and 2. Furthermore, the various parts are secured to each other, preferably by an adhesive, so that the parts are maintained in the positions illustrated and cooperating to form the enclosure 101 about the loudspeaker 150. The resultant loudspeaker assembly 100 has all of the advantages pointed out above. More specifically, the loudspeaker assembly 100 can be assembled easily and quickly without resorting to jigs and fixtures. All the parts are readily formed of material in the flat, and particularly the parts are formed of corrugated material including the inner member 110, the outer member 160, the spacer 170 and the back member 180. For illustrative purposes, each of these parts has had applied thereto an arrow indicating the direction in which the flutes of the corrugations extend, those arrows being identified as 128 on the inner member 110, 161 on the outer member 160, 172 on the spacer 170 and 182 on the back member 180. Referring particularly to FIG. 7, it will be seen that not only are two layers of corrugated board provided in each wall of the enclosure 101, but in the majority of those walls, the corrugations are crossed with respect to one another so as to give important acoustical properties to the resultant enclosure 101. More specifically, the corrugations in the front wall 102 are crossed with respect to each other, the corrugations in the side walls 103 are crossed with respect to each other, the corrugations in the rear wall 104 are crossed with respect to each other and the corrugations in the bottom wall 106 are crossed with respect to each other. The crossed patterns of corrugations serves to effect cancellation of those undesirable sound waves generated within the enclosure 101, which are not radiated outwardly through the opening in the front therof, thereby having a sound deadening or suppressing effect on the undesirable sound waves generated by the rear surface of the speaker diaphragm of the speaker 150. Even more significantly, this crossed configuration of corrugations serves to prevent the generation of undesirable audible sound waves by the walls of the enclosure 101 itself.

The speaker 150 is firmly mounted within the enclosure 101 by means of the projections 154 on the mounting flange 153 being trapped in the openings 123 provided by the cuts 119 in the side walls 116, as well as by the adhesive connection between the front surfaces 155 of the mounting flange 153 and the inner surfaces of the front panel 112. Finally, all of the panels in the inner member 110 are interconnected and secured to form an assembly about the loudspeaker 150 by means of the ears 138 and 139 engaging in the slots 122, and the adhesive connections between the rear panels 125, 135 and 145.

While the inner member 110, the outer member 160, the spacer 170 and the back members 180 have been illustrated as constructed of corrugated paper board or fiber board material for simplicity and economy of fabrication, it will be appreciated that other corrugated material may be used to produce the same sound deadening effect, as long as the adjacent layers of corrugated material have the corrugations thereof crossed in substantially all of the walls of the enclosure 101. Also, while only one loudspeaker 150 and one loudspeaker opening therefor have been shown in the loudspeaker assembly 100, it will be appreciated that any desired number of loudspeaker and corresponding openings may be provided. Furthermore, it will be understood that reflex ports and other openings may be used, depending on the acoustical requirements of a given loudspeaker assembly.

The decorative sheets 167 and 185 have been illustrated as being formed of a polyvinyl chloride resin, but it will be appreciated that any desired material may be used. Thus it is anticipated that such materials as patterned paper or other vinyl resins, either supported or non-supported, wood veneers, metals, other plastics either flexible or rigid, cloth, non-woven materials, leathers, furs, foams, stone veneers, various woven or metal fabrics or materials, cork, glass or painted or sprayed materials may be used to form the decorative sheets 167 and 185 to suit the needs and desires of individual customers.

Referring to FIGS. 8 to 14 of the drawings, there is illustrated a second embodiment of the loudspeaker assembly 200 made in accordance with and embodying the principles of the present invention. As illustrated, the loudspeaker assembly 200 includes a loudspeaker 250 having disposed therearound an enclosure 201 formed of an inner member 210, an outer member 260, a spacer 270, a grille board 275 and a back member 280.

Figure 8:
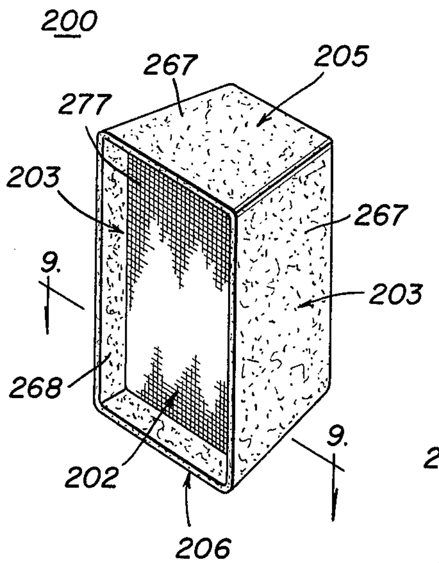
FIG. 8 is a perspective view of a second embodiment of a loudspeaker assembly made in accordance with and embodying the principles of the present invention.
Figure 9:
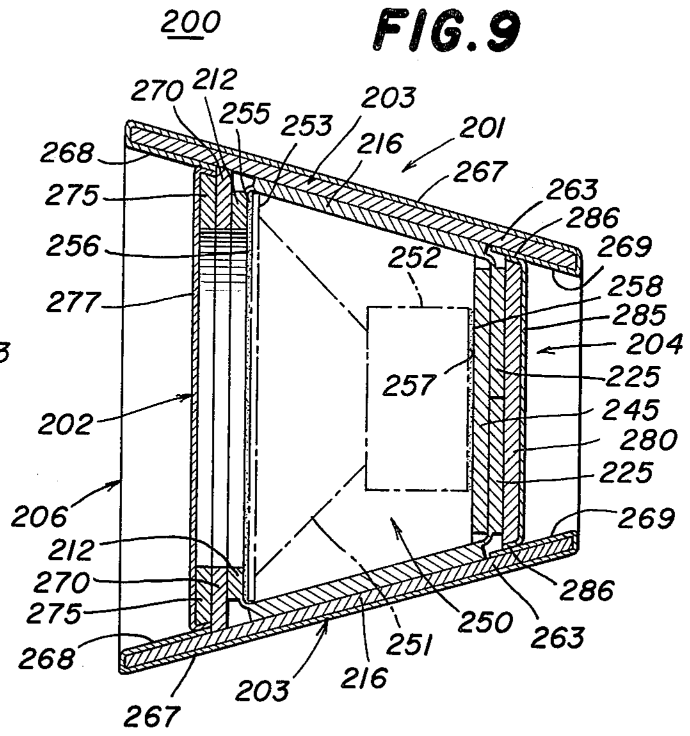
FIG. 9 is a view in horizontal section along the line 9—9 of FIG. 8.

From FIGS. 8 and 9 it will be seen that the enclosure 201 includes a front wall 202, two opposed side walls 203, a rear wall 204 and opposed top and bottom walls 205 and 206 respectively. Each of the walls 202 through 206 is formed of two layers of corrugated material, and the outer surfaces of the walls are preferably provided with a decorative covering all as will be described more fully hereinafter.

Figure 11:
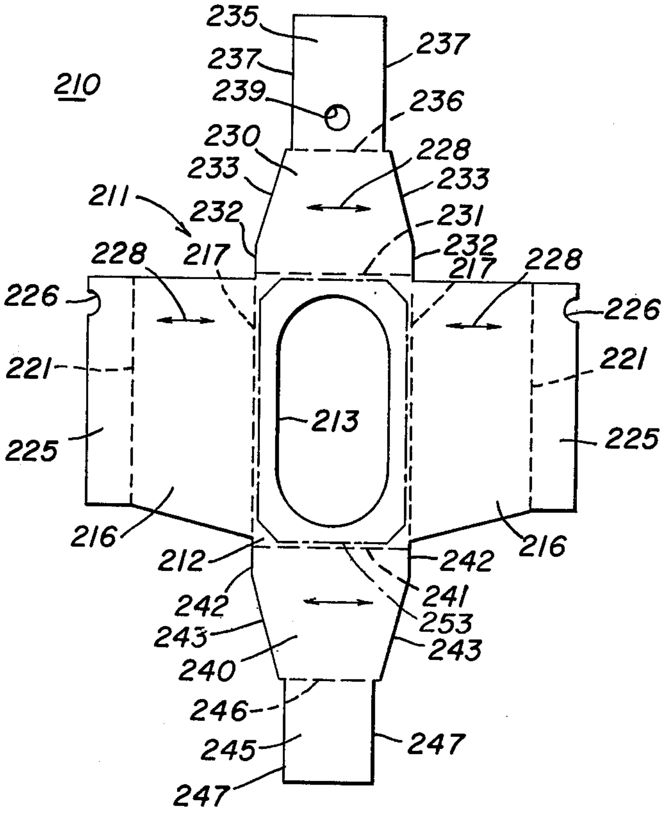
FIG. 11 is a plan view of the inner member of the loudspeaker enclosure of FIG. 8 in its flattened condition.
Figure 12:
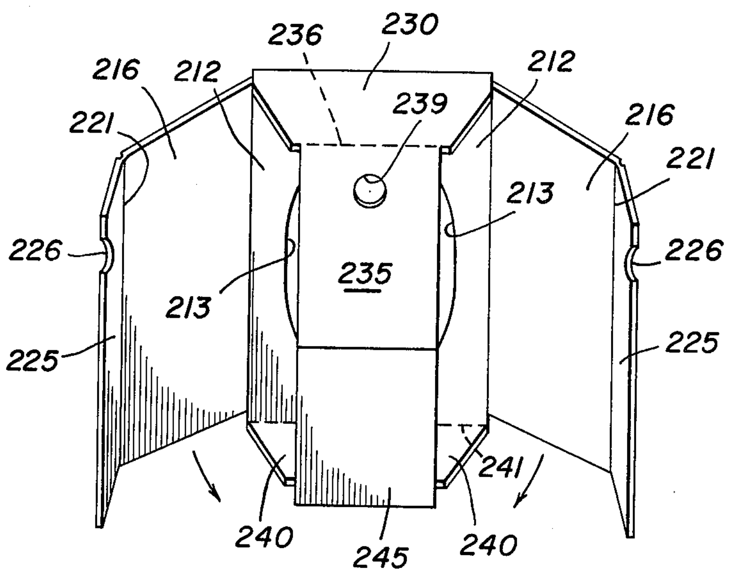
FIG. 12 is a rear view of the inner member of FIG. 11 in a partially assembled condition.
Figure 13:
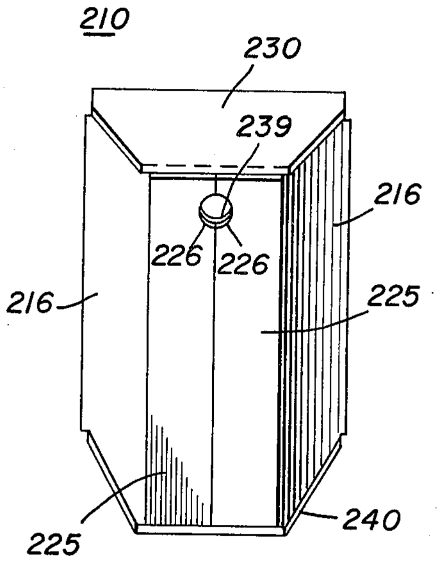
FIG. 13 is a rear view of the inner member of FIG. 11 in its fully assembled condition.

In accordance with the present invention the inner layers of walls 202 through 206 are provided by the single unitary inner member 210, the construction of which is best illustrated in FIGS. 11, 12 and 13 of the drawings. The inner member 210 consists of a single sheet 211 of corrugated material having the usual pair of liner sheets with corrugations disposed therebetween and adhesively secured thereto. The sheet 211 in turn in shaped, scored and has cutouts therein providing and defining the several parts thereof. There is provided a substantially rectangular front panel 212 that forms the inner layer of the front wall 202 and has centrally thereof an opening 213 useful in facilitating the emission of sound waves from within an enclosure 201, the opening 213 being generally oval in shape as is best illustrated in FIG. 11.

Hingedly connected to the front panel 212 are two side panels 216 which form the inner layers of the side walls 203. A low knife cut along the dashed line 217 forms the hinged connections between the front panel 212 of the side panels 216, the low knife cuts 217 being of the same character as the low knife cuts 117 described above. The outer edges of the side panels 216 carry outer rear panels 225, respectively, connected thereto by hinge portions formed by a low knife cut along the line 221 like the low knife cut 217 described above. Each of the outer rear panels 225 is generally rectangular in shape, but a semi-circular notch 226 is formed along the longer outer edge thereof adjacent to one end for a purpose to be more fully understood hereinafter.

The shorter edges of the front panel 212 carry integral thereon and hingedly attached thereto a top panel 230 and a bottom panel 240. The top panel 230 is defined at its lower edge as viewed in FIG. 11 by a perf-score 231 providing the hinged connection, the top panel 230 including opposed parallel straight edges 232 and inwardly converging tapered edges 233 that terminate at a perf-score 236 hingedly connecting an inner rear panel 235 to the outer edge of the top panel 230. The inner rear panel 235 has generally parallel side edges 237, and also has a circular opening 239 therein near the perf-score 236.

Hingedly connected to the lower edge of the front wall 212 as viewed in FIG. 11 is the bottom panel 240 connected thereto by a hinged portion formed by a perf-score 241. The bottom panel 240 includes a pair of parallel straight edges 242 joining tapered and inwardly converging side edges 243 terminating in a perf-score 246 that hingedly connects an inner rear panel 245 thereto. The inner rear panel 245 has parallel edges 247 that terminate in a straight outer edge.

Referring particularly to FIG. 9, the loudspeaker 250 includes the usual frame 251 carrying a magnet housing 252, the frame 251 having on the front thereof a mounting flange 253 having front surfaces 255 thereon, a layer of adhesive 256 being provided within the front surfaces 255 and the inner surface of the front panel 212.

The inner member 210 can be readily assembled about the loudspeaker 250 to mount the loudspeaker 250 within the inner member 210, thus to provide a sub-assembly for the loudspeaker assembly 200. The assembly of the inner member 210 about the loudspeaker 250 can be accomplished without the use of jigs or fixtures, thereby materially to simplify and to speed the assembly process. In assembling the inner member 210 about the loudspeaker 250, an adhesive is applied to the appropriate areas of the inner surface of the front panel 212 and the front surfaces 255 of the mounting flange 253. The loudspeaker 250 is then placed upon the inner member 210 as illustrated in FIG. 11, the mounting flange 253 being shown in dot-dash lines therein. The top panel 230 and the bottom panel 240 are then folded to the positions illustrated in FIG. 12, and the inner rear panels 235 and 245 are likewise folded to the positions illustrated in FIG. 12. It will be seen that the outer ends of the inner rear panels 235 and 245 meet centrally with respect to the magnet housing 252. Next the side panels 216 are folded upwardly from the positions illustrated in FIG. 11 to those illustrated in FIG. 12, and then finally to the positions illustrated in FIG. 13. The outer rear panels 225 now overlie the inner rear panels 235–245, and the notches 226 combine to form a circular opening that is in registry with the circular opening 239, the resultant opening accommodating the passage of electrical leads therethrough and/or the mounting of electrical terminals therein. A layer of adhesive (not shown) is provided between the facing surfaces of the inner rear panels 235–245 and the outer rear panels 225 firmly to secure the same together. The securing together of the rear panels firmly secures each of the panels forming the inner member 210 with respect to each other and about and with respect to the loudspeaker 250. There results a sub-assembly of the loudspeaker 250 and the inner member 210, all without the use of any jigs or fixtures during the assembly thereof.

Figure 10:
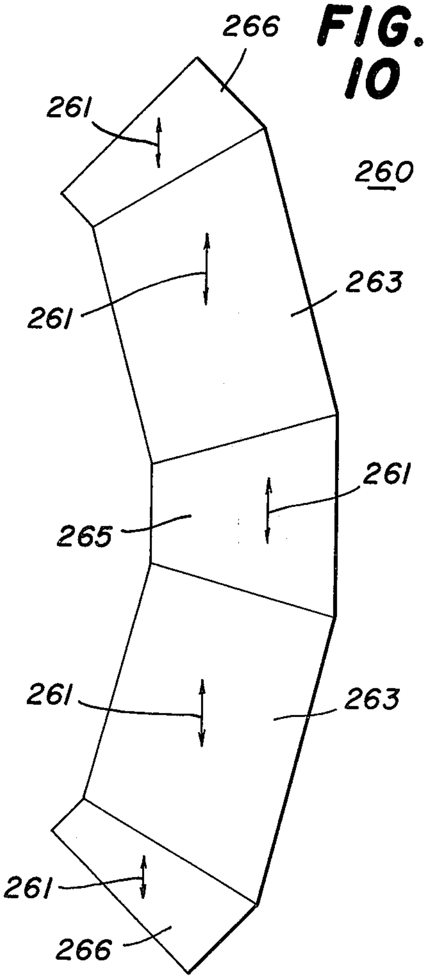
FIG. 10 is a plan view of the outer member of the loudspeaker enclosure of FIG. 8 in its flattened condition.

In order to provide the outer layer of corrugated material for each of the walls 202 through 206, an outer member 260 is placed therearound, the shape of the outer member 260 in the flat being illustrated in FIG. 10 of the drawings. Two side panels 263 are provided hingedly connected to an intermediate top panel 265. Two bottom panels 266 are provided on the outer edges of the side panels 263. As is best illustrated in FIG. 9, the outer member 260 is completely covered by a decorative sheet 267, formed for example of a synthetic organic resin such as a polyvinyl chloride resin. The decorative sheet 267 fundamentally covers the exposed portions of the outer member 260, but also is folded around the ends thereof to provide an inner front section 268 and inner rate section 269, the decorative sheet 267 being suitably secured as by adhesive to the outer member 260 substantially throughout the contacting surfaces thereof.

Disposed in front of the assembled inner member 210 is a spacer 260 of corrugated material having an oval opening 271 therein that is in registry with the oval opening 213 in the front panel 212 of the inner member 210. Disposed in front of the spacer 270 is a grille board 275 which may be formed of a composition board, and has centrally therein an oval opening 276 in general registry with the opening 271. Covering the outer surface of the grille board 275 including the opening 276 and extending around the edges thereof is a grille cloth 277. The rear of the enclosure 201 is closed by a back member 280 which has a circular opening 281 therein that registers with the openings formed by the notches 226 and the opening 239. The back member 280 is also covered by a decorative sheet 285 like the decorative sheet 267, the decorative sheet 285 extending around the edges of back member 280 as at 286.

Each of the parts of the enclosure 201, including the inner member 210, the outer member 260, the spacer 270, the grille board 275 and the back member 280 are shaped and arranged to cooperate with each other to provide a finished enclosure as illustrated in FIGS. 8 and 9. Furthermore, the various parts are secured to each other, preferably by an adhesive, so that the parts are maintained in the positions illustrated and cooperating to form the enclosure 201 about the loudspeaker 250.

Figure 14:
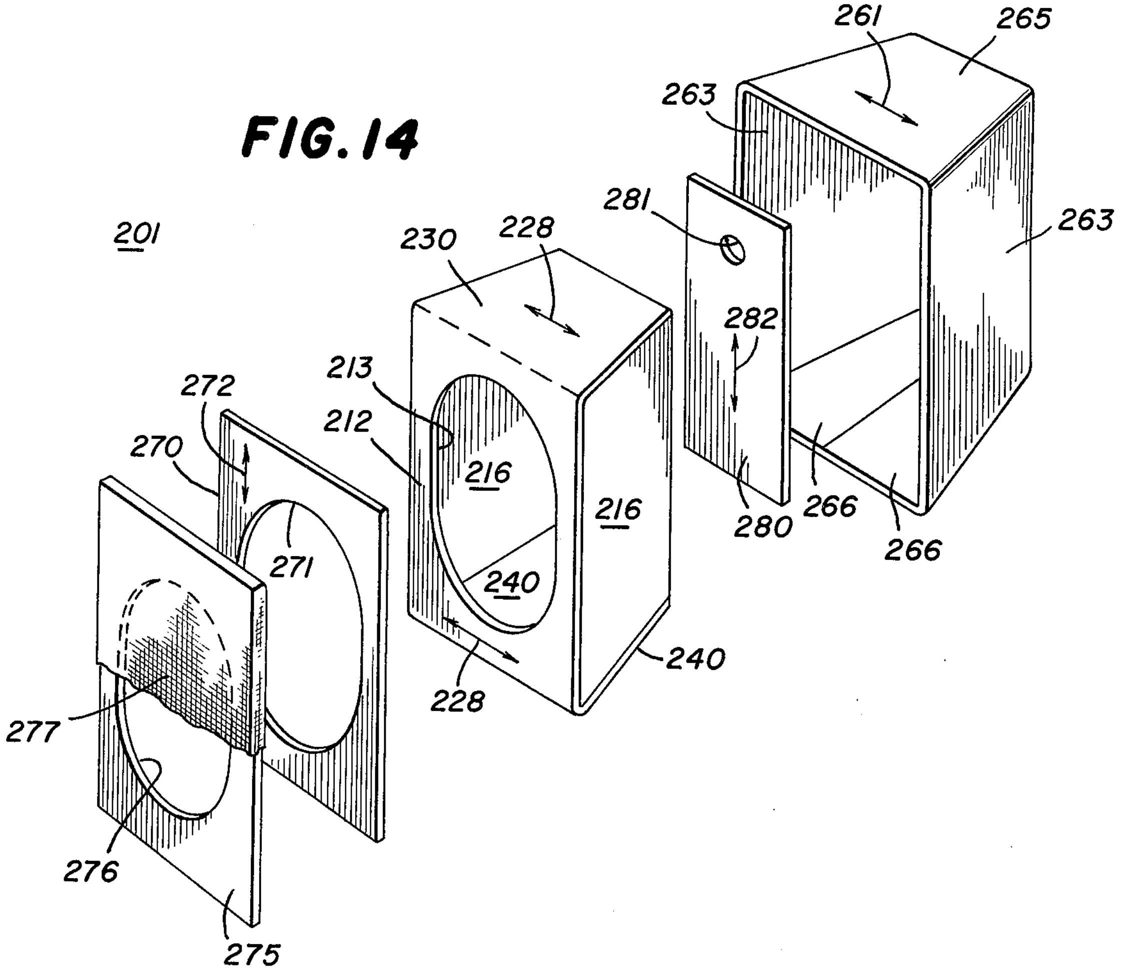
FIG. 14 is an exploded perspective view of the parts forming the loudspeaker enclosure of FIG. 8.

The resultant loudspeaker assembly 200 has all of the advantages pointed out above. More specifically, the loudspeaker assembly 200 can be assembled easily and quickly without resorting to jigs and fixtures. All the parts are readily formed of material in the flat, and particularly the parts are formed of corrugated material including the inner member 210, the outer member 260, the spacer 270 and the back member 280. For illustrative purposes, each of these parts has had applied thereto an arrow indicating the direction in which the flutes of the corrugations extend, those arrows being identified as 228 on the inner member 210, 261 on the outer member 260, 272 on the spacer 270 and 282 on the back member 280. Referring particularly to FIG. 14, it will be seen that not only are two layers of corrugated board provided in each wall of the enclosure 201, but in the majority of these walls the corrugations are crossed with respect to each other to give important acoustical properties to the resultant enclosure 201. More specifically, the corrugations in the wall 202 are crossed with respect to each other, the corrugations in the side walls 203 are crossed with respect to each other, the corrugations in the rear wall 204 are crossed with respect to each other and the corrugations in the bottom wall 206 are crossed with respect to each other. This crossed pattern of corrugations serves to effect cancellation of those undesirable sound waves generated within the speaker enclosure 201, which are not radiated outwardly through the opening in the front wall 202, thereby having a sound deadening or suppressive effect on the undesirable sound waves generated by the rear surface of the speaker diaphragm on the speaker 250. Even more significantly, this crossed pattern of corrugations serves to prevent the generation of undesirable audible sound waves by the enclosure 201 itself.

The speaker 250 is firmly mounted within the enclosure 201 by means of the adhesive connection between the front surfaces 255 of the mounting flange 253 and the inner surfaces of the front panel 212. All of the panels in the inner member 210 are interconnected and secured to form an assembly about the loudspeaker 250 by the adhesive connections between the rear panels 225, 235 and 245.

In addition, panels 216, 230 and 240 at the hinged connections thereof to the front panel 212 provide a rectangular enclosure that snugly receives the generally rectangular periphery of the front mounting flange 253 therewithin as is best seen in FIG. 11. This cooperation between the parts limits the amount of movement of the loudspeaker 250 side-to-side and up and down with respect to the inner member 210 as viewed in FIG. 11, this action being assisted by the adhesive 256 between the front panel 212 and the speaker mounting flange 253. From FIG. 9 it will be seen that the speaker 250 is also trapped in a front-to-back direction due to the spacing between the inner surface of the front wall 212 and the inner surface of the inner rear panels 235–245, the spacing therebetween being just such as to receive the loudspeaker 250. The adhesives 256 and 258 further assist in that the front surfaces 255 of the loudspeaker 250 are firmly secured by the adhesive 256 to the inner surface of the front panel 212 and the rear surfaces 257 of the magnet housing 252 are firmly secured by the adhesive 258 to the inner surfaces of the inner rear panels 235–245. As a result, the loudspeaker 250 is firmly trapped and secured within the enclosure 201 in all directions with respect thereto.

While the inner member 210, the outer member 260, the spacer 270 and the back member 280 have been illustrated as formed from corrugated fiberboard or paper board for simplicity and economy of fabrication, it will be appreciated that other corrugated materials may be used to produce the same sound deadening effect, as long as the adjacent layers of corrugated material have the corrugations thereof crossed with respect to each other in substantially all of the walls of the enclosure 201. Also, while only one loudspeaker and one opening have been shown in the loudspeaker assembly 200, it will be appreciated that any desired number of loudspeaker and corresponding openings may be provided. Furthermore, it will be understood that reflex ports and other openings may be used, depending upon the acoustical requirements of a given system. Likewise, other decorative sheets 267 and 285 may be provided in place of the polyvinyl chloride resin sheet illustrated. Thus, it is anticipated that such materials as patterned paper or vinyl resins, either supported or non-supported, wood veneers, metal, other plastics either flexible or rigid, cloths, non-woven materials, leather, furs, foams, stone veneers, various woven or metal fabrics and materials, cork, glass or painted or sprayed materials may be used to form the decorative sheets 267 and 285 to suit the needs and desires of individual customers.

While there have been described what are at present considered to be the preferred embodiments of the invention, it will be understood that various modifications may be made therein, and it is intended to cover in the appended claims all such modifications as fall within the true spirit and scope of the invention.

What is claimed is:

1. A loudspeaker assembly comprising a loudspeaker including a front mounting flange having front surfaces lying in a common plane and including a rear surface spaced from said front surfaces, and an enclosure for said loudspeaker including a front wall and a rear wall and a top wall and a bottom wall and opposed side walls, each of said walls including at least two layers of corrugated material, said front wall having an opening therein to facilitate the emission of sound waves therefrom, the inner layers of said walls being formed from a single inner member including a front panel having opposed top and bottom panels and opposed side panels hingedly connected thereto and a rear panel hingedly connected to one of said opposed panels, and fastening means holding said panels assembled with respect to each other and about said loudspeaker to provide an integral inner member for said loudspeaker assembly, said front panel engaging said front surfaces and one of said panels engaging said rear surface to trap and hold said loudspeaker in its operative position within said inner member.

2. The loudspeaker assembly set forth in claim 1, wherein said top panel and said bottom panel have rear panel sections respectively hingedly connected thereto and said side panels have rear panel sections respectively hingedly connected thereto, said rear panel sections cooperating to provide the inner rear panel of said rear wall.

3. The loudspeaker assembly set forth in claim 1, wherein said top panel and said bottom panel have inner rear panel sections respectively hingedly connected thereto and said side panels have outer rear panel sections respectively hingedly connected thereto, said outer rear panel sections overlying said inner rear panel sections to provide the inner rear panel of said rear wall.

4. The loudspeaker assembly set forth in claim 1, and further comprising an adhesive between the front surfaces of said loudspeaker and the inner surfaces of said front panel.

5. A loudspeaker assembly comprising a loudspeaker including a front mounting flange having front surfaces lying in a common plane and including a rear surface spaced from said front surfaces, and an enclosure for said loudspeaker including a front wall and a rear wall and a top wall and a bottom wall and opposed side walls, each of said walls including at least two layers of corrugated material, said front wall having an opening therein to facilitate the emission of sound waves therefrom, the inner layers of said walls being formed from a single inner member including a front panel having opposed top and bottom panels and opposed side panels hingedly connected thereto and rear panel sections respectively hingedly connected to said opposed panels, two of said rear panel sections cooperating to provide an inner rear panel and the other two of said rear panel sections cooperating to provide an outer rear panel, said inner rear panel sections having laterally extending ears thereon and said panels carrying said outer rear panel sections having slots therein receiving said ears to hold said rear panel sections and said opposed top and bottom panels and said opposed side panels in the assembled positions thereof, and fastening means holding said panels assembled with respect to each other and about said loudspeaker to provide an integral inner member for said loudspeaker assembly, said front panel engaging said front surfaces and one of said panels engaging said rear surface to trap and hold said loudspeaker in its operative position within said inner member.

6. The loudspeaker assembly set forth in claim 5, wherein said opposed top and bottom panels carry said inner rear panel sections respectively hingedly connected thereto and said opposed side panels carry said outer rear panel sections hingedly connected thereto.

7. The loudspeaker assembly set forth in claim 5, wherein said laterally extending ears are disposed adjacent to the outer ends of said inner rear panel sections and said slots are disposed in essentially the center of the associated panels.

8. A loudspeaker assembly comprising a loudspeaker including a front mounting flange having laterally extending projections thereon with front surfaces lying in a common plane, and an enclosure for said loudspeaker including a front wall and a rear wall and a plurality of opposed side walls, each of said walls including at least two layers of corrugated material, said front wall having an opening therein to facilitate the emission of sound waves therefrom, the inner layer of two of said opposed side walls adjacent to the juncture with the inner layer of said front wall having slots therein receiving one of said projections, said inner layer of said front wall having the inner surface thereof adhesively secured to the adjacent front surfaces of said loudspeaker mounting flange lying in said common plane, said projections of said loudspeaker in said slots of said side walls and the adhesive connection between said front surfaces of said loudspeaker and said inner layer of said front wall trapping and securing said loudspeaker against said front wall within said enclosure.

9. The loudspeaker assembly set forth in claim 8, wherein the inner layer of said two opposing side walls are integral with and hingedly connected to the inner layer of said front wall, the material from said slots in said opposing side walls remains integral with and forms a part of said inner front wall and extends laterally with respect to said inner layers of said side walls to provide additional support for said loudspeaker mounting flange.

10. A loudspeaker assembly comprising a loudspeaker including a front mounting flange having laterally extending projections thereon with front surfaces lying in a common plane, and an enclosure for said loudspeaker including a front wall and a rear wall and a top wall and a bottom wall and opposed side walls, each of said walls including at least two layers of corrugated material, said front wall having an opening therein to facilitate the emission of sound waves therefrom, the inner layers of said walls being formed from a single inner member including a front panel having opposed top and bottom panels and opposed side panels hingedly connected thereto and rear panel sections respectively hingedly connected to said opposed panels, two of said opposed panels adjacent to the juncture with the inner layer of said front wall having slots therein each receiving one of said projections, two of said rear panel sections cooperating to provide an inner rear panel and the other two of said rear panel sections cooperating to provide an outer rear panel, said inner rear panel sections having laterally extending ears thereon and said panels carrying said outer rear panel sections having slots therein receiving said ears to hold said rear panel sections and said opposed top and bottom panels and said opposed side panels in the assembled positions thereof, and means holding said panels assembled with respect to each other and about said loudspeaker to provide an integral inner member for said loudspeaker assembly.

11. The loudspeaker assembly set forth in claim 10, wherein said loudspeaker has the front surface thereof adhesively secured to the inner surface of said front panel.

12. The loudspeaker assembly set forth in 10, wherein said means holding said panels assembled with respect to each other includes adhesive disposed between said rear panel sections to interconnect the same.

13. The loudspeaker assembly set forth in claim 10, wherein said laterally extending ears are disposed adjacent to the outer ends of said inner rear panel sections and said slots are disposed in essentially the center of the associated panels.

14. A loudspeaker assembly comprising a loudspeaker including a front mounting flange having front surfaces lying in a first common plane and a rear plate with rear surfaces thereon lying in a second common plane, and an enclosure for said loudspeaker including a front wall and a rear wall and a plurality of opposed side walls, each of said walls including at least two layers of corrugated materials, said front wall having an opening therein to facilitate the emission of sound waves therefrom, the inner layers of said opposed side walls adjacent to the juncture with the inner layer of said front wall snugly receiving the periphery of said front mounting flange therebetween, the inner surfaces of the inner layers of said front wall and said rear wall snugly receiving said loudspeaker therebetween with said front surfaces being disposed adjacent to the inner surfaces of said front wall and with said rear surfaces being disposed adjacent to the inner surfaces of said rear wall, thereby to trap and secure said loudspeaker within said enclosure in all directions with respect thereto.

15. The loudspeaker assembly set forth in claim 14, wherein the front surfaces of said front mounting flange are adhesively secured to the inner surface of said inner layer of said front wall, and the rear surfaces of said rear plates are adhesively secured to the inner surface of the inner layer of said rear wall.

16. A loudspeaker assembly comprising a loudspeaker including a front mounting flange having front surfaces lying in a first common plane and a rear plate with rear surfaces thereon lying in a second common plane, and an enclosure for said loudspeaker including a front wall and a rear wall and a top wall and a bottom wall and opposed side walls, each of said walls including at least two layers of corrugated material, said front wall having an opening therein to facilitate the emission of sound waves therefrom, the inner layers of said walls being formed from a single inner member including a front panel having opposed top and bottom panels and opposed side panels hingedly connected thereto and rear panel sections respectively hingedly connected to said opposed panels, said opposed top and bottom panels and said opposed side panels adjacent to the juncture with said front panel snugly receiving the periphery of said mounting flange therebetween, two of said rear panel sections cooperating to provide an inner rear panel and the other two of said rear panel sections cooperating to provide an outer rear panel, the inner surface of said front panel and the inner surface of said inner rear panel snugly receiving said loudspeaker therebetween with said front surfaces being disposed adjacent to the inner surface of said front panel and with said rear surface being disposed adjacent to said inner rear panel, and means holding said panels assembled with respect to each other and about said loudspeaker to provide an integral inner member for said loudspeaker assembly, thereby to trap and secure said loudspeaker within said enclosure in all directions with respect thereto.

17. The loudspeaker assembly set forth in claim 16, wherein the front surfaces of said mounting flange are adhesively secured to the inner surface of said front panel, and the rear surfaces of said rear plate are adhesively secured to the inner surface of said inner rear panel.

18. A loudspeaker sub-assembly comprising a loudspeaker including a front mounting flange having front surfaces lying in a common plane and including a rear surface spaced from said front surfaces, and an enclosure for said loudspeaker including a single unitary member formed of corrugated material, said inner member including a front panel having opposed top and bottom panels and opposed side panels hingedly connected thereto and a rear panel hingedly connected to one of said opposed panels, and fastening means holding said panels assembled with respect to each other and about said loudspeaker to provide an integral inner member for said loudspeaker sub-assembly, said front panel engaging said front surfaces and one of said panels engaging said rear surface to trap and hold said loudspeaker in its operative position within said inner member.

19. A loudspeaker sub-assembly comprising a loudspeaker including a front mounting flange having front surfaces lying in a common plane and including a rear surface spaced from said front surfaces, and an enclosure for said loudspeaker including a single unitary inner member formed of corrugated material, said inner member including a front panel having opposed top and bottom panels and opposed side panels hingedly connected thereto and rear panel sections respectively hingedly connected to said opposed panels, two of said rear panel sections cooperating to provide an inner rear panel and the other two of said rear panel sections cooperating to provide an outer rear panel, said inner rear panel sections having laterally extending ears thereon and said panels carrying said outer rear panel sections having slots therein receiving said ears to hold said rear panel sections and said opposed top and bottom panels and said opposed side panels in the assembled positions thereof, and fastening means holding said panels assembled with respect to each other and about said loudspeaker to provide an integral inner member for said loudspeaker sub-assebly, said front panel engaging said front surfaces and one of said panels engaging said rear surface to trap and hold said loudspeaker in its operative position within said inner member.

20. A loudspeaker sub-assembly comprising a loudspeaker including a front mounting flange having front surfaces lying in a first common plane and a rear plate with rear surfaces thereon lying in a second common plane, and an enclosure for said loudspeaker including a single unitary inner member formed of corrugated material, said inner member including a front panel having opposed top and bottom panels and opposed side panels hingedly connected thereto and rear panel sections respectively hingedly connected to said opposed panels, said opposed top and bottom panels and said opposed side panels adjacent to the juncture with said front panel snugly receiving the periphery of said mounting flange therebetween, two of said rear panel sections cooperating to provide an inner rear panel and the other two of said rear panel sections cooperating to provide an outer rear panel, the inner surface of said front panel and the inner surface of said inner rear panel snugly receiving said loudspeaker therebetween with said front surfaces being disposed adjacent to the inner surface of said front panel and with said rear surfaces being disposed adjacent to said inner rear panel, and means holding said panels assembled with respect to each other and about said loudspeaker to provide an integral inner member for said loudspeaker sub-assembly, thereby to trap and secure said loudspeaker within said enclosure in all directions with respect thereto.

21. The loudspeaker sub-assembly set forth in claim 20, wherein the front surfaces of said mounting flange are adhesively secured to the inner surface of said front panel, and the rear surfaces of said rear plate are adhesively secured to the inner surface of said inner rear panel.

* * * * *